(12) United States Patent
Lee et al.

(10) Patent No.: US 9,281,094 B2
(45) Date of Patent: Mar. 8, 2016

(54) METHOD OF FORMING COPPER FILM ON MO/SUS FLEXIBLE SUBSTRATE

(71) Applicant: KOREA UNIVERSITY RESEARCH AND BUSINESS FOUNDATION, Seoul (KR)

(72) Inventors: Chi-Woo Lee, Seoul (KR); Mi-Kyung Oh, Sejong (KR); Jeom-Sik Yang, Seoul (KR); Su-Byeong Chae, Cheongwon-gun (KR); Sang-Min Lee, Pyeongtaek (KR)

(73) Assignee: Korea University Research and Business Foundation, Seoul (KR)

( * ) Notice: Subject to any disclaimer, the term of this patent is extended or adjusted under 35 U.S.C. 154(b) by 234 days.

(21) Appl. No.: 14/090,030

(22) Filed: Nov. 26, 2013

(65) Prior Publication Data

US 2014/0295211 A1    Oct. 2, 2014

(30) Foreign Application Priority Data

Mar. 27, 2013   (KR) .......................... 10-2013-0032761

(51) Int. Cl.
| | | |
|---|---|---|
| *C25D 3/38* | (2006.01) | |
| *H01B 1/02* | (2006.01) | |
| *B32B 15/01* | (2006.01) | |
| *C22C 9/00* | (2006.01) | |
| *H01L 31/032* | (2006.01) | |
| *H01L 31/0392* | (2006.01) | |

(52) U.S. Cl.
CPC ................ *H01B 1/026* (2013.01); *B32B 15/01* (2013.01); *C22C 9/00* (2013.01); *H01L 31/0322* (2013.01); *H01L 31/03928* (2013.01); *Y10T 428/12826* (2015.01)

(58) Field of Classification Search
CPC ................................. B32B 15/01; C25D 3/38
USPC ........................................... 428/606; 205/291
See application file for complete search history.

(56) References Cited

U.S. PATENT DOCUMENTS

| | | | | |
|---|---|---|---|---|
| 3,294,654 A | * | 12/1966 | Vello ........................ | C25D 5/38 205/158 |
| 2005/0130423 A1 | * | 6/2005 | Pyo ..................... | H01L 23/5227 438/689 |
| 2012/0231574 A1 | * | 9/2012 | Wang ................... | C25D 7/0621 438/95 |

FOREIGN PATENT DOCUMENTS

| | | |
|---|---|---|
| KR | 10-2010-0082915 A | 7/2010 |
| KR | 10-2011-0038391 A | 4/2011 |
| KR | 10-2012-0115779 A | 10/2012 |

OTHER PUBLICATIONS

Kapur et al., "Low Cost Thin Film Chalcopyrite Solar Cells," IEEE © no month, 1985, pp. 1429-1432.*

(Continued)

*Primary Examiner* — Edna Wong
(74) *Attorney, Agent, or Firm* — Mintz Levin Cohn Ferris Glovsky and Popeo, P.C.; Kongsik Kim

(57) ABSTRACT

This invention relates to a method of forming a copper film on a Mo/SUS flexible substrate, which enables the copper film to be uniformly formed on the Mo/SUS flexible substrate in a short period of time by applying current and in which the copper film becomes thicker in proportion to an increase in a concentration of a copper precursor aqueous solution or in a current density.

3 Claims, 3 Drawing Sheets

(56) References Cited

OTHER PUBLICATIONS

Cha et al., "Effect of Thermal Annealing on the Structure, Morphology, and Electrical Properties of Mo Bottom Electrodes for Solar Cell Applications," Journal of the Korean Physical Society (Sep. 2011), vol. 59, No. 3, pp. 2280-2285.*

Oh et al., "Morphology and Thickness Control of Thin Copper Films Prepared by Electrochemical Deposition onto Mo-Sputtered Stainless Steel Substrates," Bull. Korean Chem. Soc. (no month, 2012), vol. 33, No. 12, pp. 3935-3936.*

Klochko, N.P., et al. "Electrodeposition of Cu—In—Se precursors for chalcopyrite solar cells", Functional Materials, 18, No. 3 (2011), pp. 328-334.

* cited by examiner

METHOD OF FORMING COPPER FILM ON MO/SUS FLEXIBLE SUBSTRATE

CROSS REFERENCE TO RELATED APPLICATION

This application claims the benefit of Korean Patent Application No. KR 10-2013-0032761, filed Mar. 27, 2013, which is hereby incorporated by reference in its entirety into this application.

TECHNICAL FIELD

The present invention relates to a method of forming a copper film on a Mo/SUS flexible substrate.

RELATED ART

Solar cells are receiving attention as energy sources which are, in terms of energy crisis and environmental problems, eco-friendly and renewable. Solar cells are exemplified by silicon solar cells, CIGS, CdTe, dye-sensitized solar cells, novel solar cells using nano technology, etc. Conventional silicon solar cells exhibit the highest efficiency, but are limited in reducing the costs thereof because of an increase in silicon material price and complicated manufacturing processes. With the goal of solving such problems, technology for depositing a thin-film solar cell on a thin glass substrate is being highlighted.

CIGS solar cells include electrodes on typical glass substrates, wherein an optical absorption layer for absorbing solar light is formed of CIGS (copper, indium, gallium, selenium). There is high interest in CIGS solar cells because of their high efficiency and long-term stability. A CIGS optical absorption layer is formed using a deposition process, a physical deposition process, or an electrochemical electrodeposition process. In particular, an electrochemical deposition process is advantageous because of high uniformity, low cost, high yield and ease of formation of a large area. Whereas, a vacuum deposition process incurs high cost, complicates the device and has high sample loss, and is thus limited in commercialization of CIGS solar cells.

Electrodeposition of a CIGS precursor is carried out via a single step or multiple steps including two or three steps. This process may be conducted using, for example, Cu/In/Ga, Cu—Ga/In/Se, Cu/In/Ga—Se, Cu/In—Se/Ga—Se, etc. Commercialization of CIGS solar cells requires surface uniformity, appropriate film thickness and a fast production rate.

SUMMARY

Accordingly, the present invention has been made keeping in mind the above problems encountered in the related art, and an object of the present invention is to provide a method of forming a copper film having a uniform particle size on a Mo/SUS flexible substrate for a short period of time using an electrodeposition process.

In order to accomplish the above object, the present invention provides a method of forming a copper film, including a) immersing a Mo/SUS flexible substrate and a counter electrode in a mixture of a copper precursor aqueous solution and an electrolyte aqueous solution which are mixed so that the molar ratio of a copper precursor and an electrolyte is 1:1.2~1:0.1; and b) applying current at a current density of 20~120 mA/cm$^2$ for 2~10 sec, so that the copper film is electrodeposited on the Mo/SUS flexible substrate.

In addition, the present invention provides a copper film formed by the above method.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
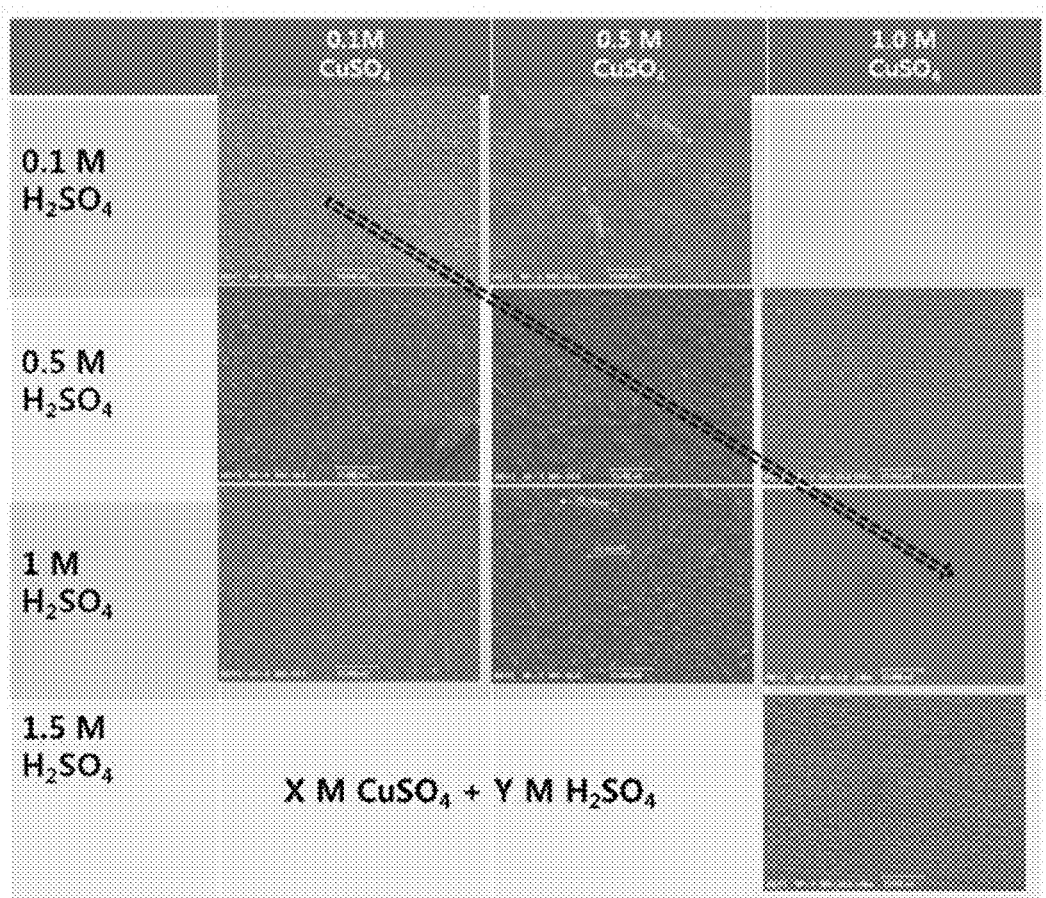
FIG. 1 is of images illustrating the surfaces of copper films of Examples 1 to 5 and Comparative Examples 1 to 4 measured at a current density of 60 mA/cm$^2$.
Figure 2:
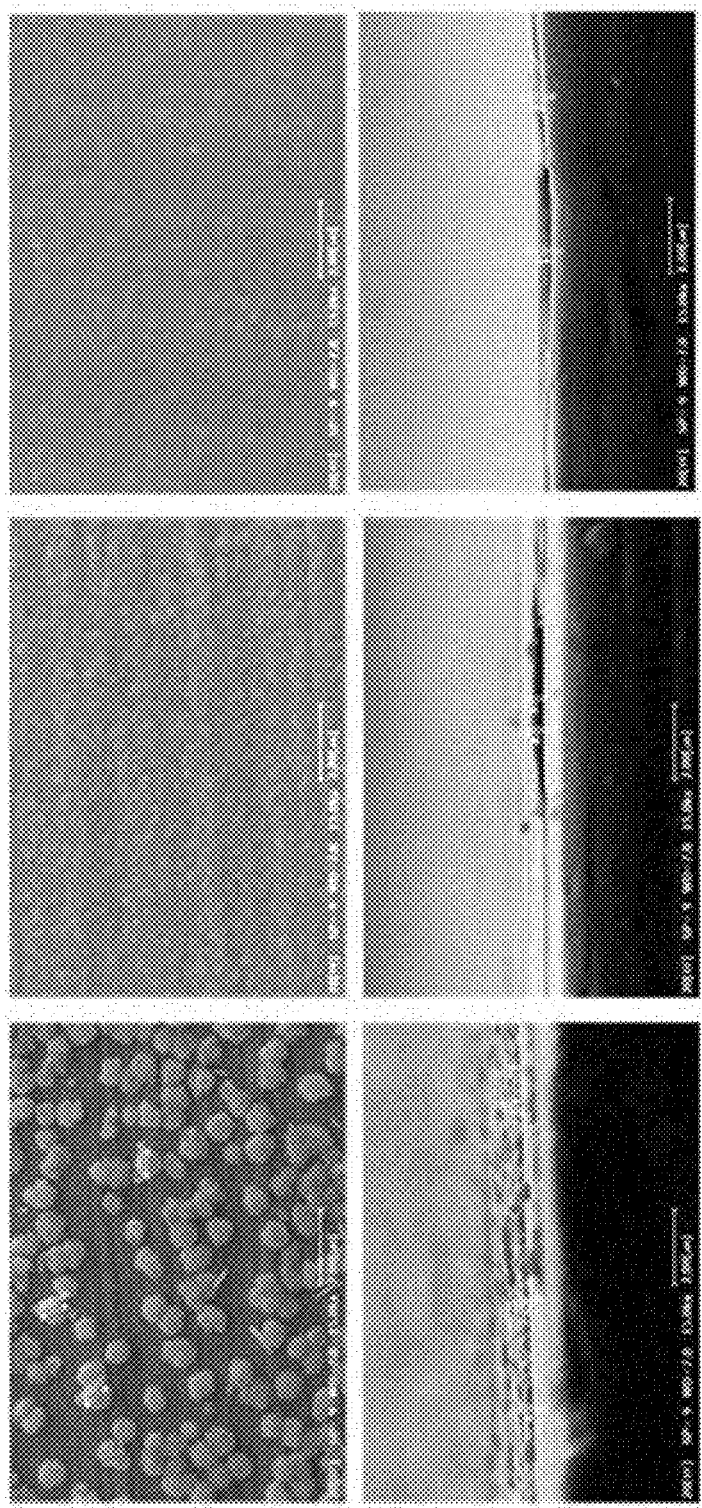
FIGS. 2A, 2B and 2C are images illustrating the surface and thickness of the copper film of Example 1 at current densities of 30 mA/cm$^2$, 60 mA/cm$^2$ and 110 mA/cm$^2$, respectively.

Hereinafter, a detailed description will be given of the present invention.

The present invention pertains to a method of forming a copper film on a Mo/SUS flexible substrate, including a) immersing a Mo/SUS flexible substrate and a counter electrode in a mixture of a copper precursor aqueous solution and an electrolyte aqueous solution which are mixed so that the molar ratio of a copper precursor and an electrolyte is 1:1.2~1:0.1; and b) applying current at a current density of 20~120 mA/cm$^2$ for 2~10 sec, so that the copper film is electrodeposited on the Mo/SUS flexible substrate.

The above method enables the formation of a thin film having a nano thickness in an aqueous solution phase in a short period of time using an electrochemical process, not a vacuum deposition process, and thereby the copper film may be formed in a short period of time without the use of an additive.

In a), the copper precursor may have a concentration of 0.1~2.0 M, and may include at least one selected from the group consisting of copper sulfate, copper chloride and copper cyanide. Particularly useful is copper sulfate. Because a thin film using copper electrodeposition is formed at the same time of flow of applied current in the presence of a high-concentration solution, the concentration of the copper precursor aqueous solution is preferably set to 1 M. The concentration of the electrolyte aqueous solution is 0.1~2.0 M, and at least one selected from the group consisting of sulfuric acid, hydrochloric acid and nitric acid may be used. Particularly useful is sulfuric acid.

As the pH of the mixture in a) decreases, the core of copper is not produced, and thus electrodeposition does not occur efficiently. Accordingly, in order to uniformly electrodeposit the copper film on the Mo/SUS flexible substrate, the amount of the copper precursor should be equal to or greater than the amount of the electrolyte, and a molar ratio of 1:1~1:0.5 is preferable.

In the present invention, the Mo/SUS flexible substrate may be manufactured by electrodepositing molybdenum (Mo) on stainless steel. The counter electrode is composed of a platinum mesh, titanium carbon, etc., and any conductor may be used without particular limitation so long as it has high conductivity and is stable in an acidic solution.

In b), when current is applied, the copper film may be very quickly formed for 2~10 sec.

According to the present invention, the copper film is employed in a CIGS solar cell, and the thickness of the copper film may be adjusted depending on the current density applied in b). Generally, the thickness of a CIGS solar cell manufactured using a layer-by-layer electrodeposition process is preferably set to 1~2 μm. Therefore, the copper film preferably has a thickness of 250~500 nm so as to be adapted for the CIGS solar cell, and the copper film having the above thickness is formed by applying current at a current density of 50~110 mA/cm$^2$. More preferably, the thickness of the copper film is set to 300~400 nm To this end, current is applied at a current density of 60~90 mA/cm$^2$.

In addition, the present invention pertains to a copper film formed by a) and b) as above, and the surface and thickness of the copper film are analyzed using a scanning electron microscope (SEM).

Below is a description of the following examples of the present invention.

The following examples illustrate the present invention but are not construed as limiting the present invention.

Example 1

Formation of Copper Film on Mo/SUS Flexible Substrate in Mixture of 1.0 M Copper Sulfate Aqueous Solution and 1.0 M Sulfuric Acid Aqueous Solution This example was performed at room temperature, and an analytical grade reagent and tertiary distilled water were used. Direct current voltage was applied to 430 CSP stainless steel having high tension, so that Mo was electrodeposited to a thickness of 500 nm, thus manufacturing a Mo/SUS flexible substrate having a size of 100 mm×100 mm. The Mo/SUS flexible substrate was used as a work electrode, and a platinum mesh was used as a counter electrode. A 1.0 M sulfuric acid aqueous solution and a 1.0 M copper sulfate aqueous solution were mixed at a volume ratio of 1:1, after which the Mo/SUS flexible substrate and the counter electrode were immersed in the mixture and current was applied at a current density of 50~110 mA/cm$^2$ for 10 sec, thus forming a copper film.

Example 2

Formation of Copper Film on Mo/SUS Flexible Substrate in Mixture of 0.1 M Copper Sulfate Aqueous Solution and 0.1 M Sulfuric Acid Aqueous Solution A copper film was formed in the same manner as in Example 1, with the exception that a 0.1 M copper sulfate aqueous solution and a 0.1 M sulfuric acid aqueous solution were used.

Example 3

Formation of Copper Film on Mo/SUS Flexible Substrate in Mixture of 0.5 M Copper Sulfate Aqueous Solution and 0.5 M Sulfuric Acid Aqueous Solution A copper film was formed in the same manner as in Example 1, with the exception that a 0.5 M copper sulfate aqueous solution and a 0.5 M sulfuric acid aqueous solution were used.

Example 4

Formation of Copper Film on Mo/SUS Flexible Substrate in Mixture of 1.0 M Copper Sulfate Aqueous Solution and 0.5 M Sulfuric Acid Aqueous Solution A copper film was formed in the same manner as in Example 1, with the exception that a 1.0 M copper sulfate aqueous solution and a 0.5 M sulfuric acid aqueous solution were used.

Example 5

Formation of Copper Film on Mo/SUS Flexible Substrate in Mixture of 0.5 M Copper Sulfate Aqueous Solution and 0.1 M Sulfuric Acid Aqueous Solution A copper film was formed in the same manner as in Example 1, with the exception that a 0.5 M copper sulfate aqueous solution and a 0.1 M sulfuric acid aqueous solution were used.

Comparative Example 1

Formation of Copper Film on Mo/SUS Flexible Substrate in Mixture of 0.1 M Copper Sulfate Aqueous Solution and 0.5 M Sulfuric Acid Aqueous Solution A copper film was formed in the same manner as in Example 1, with the exception that a 0.1 M copper sulfate aqueous solution and a 0.5 M sulfuric acid aqueous solution were used.

Comparative Example 2

Formation of Copper Film on Mo/SUS Flexible Substrate in Mixture of 0.1 M Copper Sulfate Aqueous Solution and 1.0 M Sulfuric Acid Aqueous Solution A copper film was formed in the same manner as in Example 1, with the exception that a 0.1 M copper sulfate aqueous solution and a 1.0 M sulfuric acid aqueous solution were used.

Comparative Example 3

Formation of Copper Film on Mo/SUS Flexible Substrate in Mixture of 0.5 M Copper Sulfate Aqueous Solution and 1.0 M Sulfuric Acid Aqueous Solution A copper film was formed in the same manner as in Example 1, with the exception that a 0.5 M copper sulfate aqueous solution and a 1.0 M sulfuric acid aqueous solution were used.

Comparative Example 4

Formation of Copper Film on Mo/SUS Flexible Substrate in Mixture of 1.0 M Copper Sulfate Aqueous Solution and 1.5 M Sulfuric Acid Aqueous Solution A copper film was formed in the same manner as in Example 1, with the exception that a 1.0 M copper sulfate aqueous solution and a 1.5 M sulfuric acid aqueous solution were used.

Test Example 1

Analysis of Surface of Copper Film at Current Density of 60 mA/cm$^2$

The surface of the copper film was observed using SEM (COXEMCX-100) at a current density of 60 mA/cm$^2$ depending on the concentrations of the copper sulfate aqueous solution and the sulfuric acid aqueous solution (FIG. 1).

In Comparative Examples 1 to 4 in which the concentration of the sulfuric acid aqueous solution is higher than that of the copper sulfate aqueous solution, electrodeposition of the copper film did not occur well. This is because the activity of Mo of the substrate varies depending on the molar ratio of the copper sulfate aqueous solution and the sulfuric acid aqueous solution. At a low molar ratio of the copper sulfate aqueous solution and the sulfuric acid aqueous solution, the core of copper was not efficiently formed, and thus the copper film was not effectively electrodeposited.

The most uniform copper film was formed at a 1:1 molar ratio of the copper sulfate aqueous solution and the sulfuric acid aqueous solution.

Test Example 2

Measurement of Thickness of Copper Film of Example 1 Depending on Current Density The thickness of the copper film and the size of copper particles depending on the current density were observed using SEM (COXEMCX-100).

Figure 3:
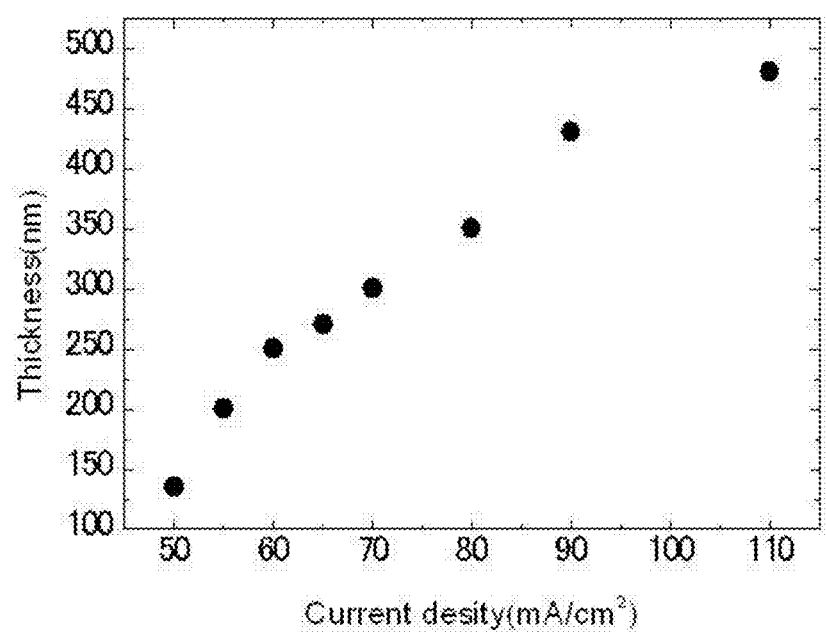
FIG. 3 is a graph illustrating the thickness of the copper film of Example 1 at different current densities.

The uniformity of copper particles increased at a current density of 60 mA/cm$^2$ or more, and flower-shaped copper particles having a size of equal to or greater than tens of μm (>10 μm) were electrodeposited at a low current density of 30 mA/cm$^2$ in the presence of 0.5 M or less copper sulfate aqueous solution. Also, the thickness of the copper film to be electrodeposited varied depending on the current density. The thickness of the copper film was set to less than 200 nm at a current density of 30 mA/cm$^2$, 250~280 nm at a current density of 60 mA/cm$^2$, and 480~500 nm at a current density of 110 mA/cm$^2$. Ultimately, the higher the current density, the thicker the copper film. Changes in thickness of the copper film depending on the current density are illustrated in FIG. 3.

As described hereinbefore, the present invention provides a method of forming a copper film on a Mo/SUS flexible substrate. According to the present invention, the method enables the formation of a thin film having a nano thickness in a short period of time, and thus impurities are not produced because the copper film is formed on a Mo/SUS flexible substrate without the use of an additive. Also, copper particles having a uniform size are formed into a thin film for a short period of time, thus increasing the production rate and productivity, and thereby the method of the present invention can be efficiently applied to CIGS solar cell industries.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A method of forming a copper film, comprising:
   a) immersing a Mo/SUS flexible substrate and a counter electrode in a mixture of a copper precursor aqueous solution and an electrolyte aqueous solution which are mixed so that a molar ratio of a copper precursor and an electrolyte is 1:1~1:0.5; and
   b) applying current at a current density of 20~120 mA/cm$^2$ for 2~10 sec, so that the copper film is electrodeposited on the Mo/SUS flexible substrate,
   wherein in b), the current is applied at the current density of 60~90 mA/cm$^2$ to electrodeposit the copper film having a thickness of 300~400 nm.

2. The method of claim 1, wherein the copper precursor is an aqueous solution of at least one copper precursor selected from the group consisting of copper sulfate, copper chloride and copper cyanide, and has a concentration of 0.1~2.0 M.

3. The method of claim 1, wherein the electrolyte is an aqueous solution of at least one electrolyte selected from the group consisting of sulfuric acid, hydrochloric acid and nitric acid, and has a concentration of 0.1~2.0 M.

* * * * *